United States Patent [19]

Chen et al.

[11] Patent Number: 5,461,010
[45] Date of Patent: Oct. 24, 1995

[54] TWO STEP ETCH BACK SPIN-ON-GLASS PROCESS FOR SEMICONDUCTOR PLANARIZATION

[75] Inventors: Lai-Juh Chen, Hsin-Chu; Shaw-Tzeng Hsia, Taipei, both of Taiwan

[73] Assignee: Industrial Technology Research Institute, Hsinchu, Taiwan

[21] Appl. No.: 258,997

[22] Filed: Jun. 13, 1994

[51] Int. Cl.⁶ .................................. H01L 21/465
[52] U.S. Cl. ................. 437/228; 437/195; 437/229; 437/231; 437/235; 156/643.1; 156/633.1; 156/628.1; 156/631.1; 156/653.1
[58] Field of Search .................... 437/228, 229, 437/231, 235, 195; 156/643.1, 633.1, 628.1, 631.1, 653.1

[56] References Cited

U.S. PATENT DOCUMENTS

| | | | |
|---|---|---|---|
| 4,826,786 | 5/1989 | Merenda et al. | 437/195 |
| 4,894,351 | 1/1990 | Batty | 437/190 |
| 4,952,274 | 8/1990 | Abraham | 156/643.1 |
| 4,983,546 | 1/1991 | Hyun et al. | 437/231 |
| 4,986,878 | 1/1991 | Malazgirt et al. | 156/643.1 |
| 5,003,062 | 3/1991 | Yen | 437/231 |
| 5,173,151 | 12/1992 | Namose | 156/643.1 |
| 5,266,525 | 11/1993 | Morozumi | 437/195 |
| 5,268,244 | 12/1993 | Yoo | 430/5 |
| 5,294,294 | 3/1994 | Namose | 156/643 |
| 5,296,092 | 3/1994 | Kim | 156/643.1 |
| 5,316,980 | 5/1994 | Takeshiro | 437/228 |
| 5,350,486 | 9/1994 | Huang | 437/228 |
| 5,376,435 | 12/1994 | Morozumi | 428/210 |
| 5,378,318 | 1/1995 | Weling et al. | 156/662 |
| 5,391,259 | 2/1995 | Cathey et al. | 156/643 |
| 5,401,998 | 3/1995 | Chiu et al. | 257/368 |

FOREIGN PATENT DOCUMENTS

| | | | |
|---|---|---|---|
| 0250656 | 10/1987 | Japan | 437/228 |
| 0212439 | 8/1989 | Japan | 437/228 |
| 0180052 | 7/1990 | Japan | 437/228 |
| 6037069 | 2/1994 | Japan | 437/228 |

Primary Examiner—Olik Chaudhuri
Assistant Examiner—Long Pham
Attorney, Agent, or Firm—George O. Saile

[57] ABSTRACT

A new method for forming a planarized dielectric layer on a patterned conducting layer was accomplished. The method involves forming a insulating layer over a semiconductor substrate having semiconductor devices and elevated areas, created by an array of DRAM storage cells, formed therein. A metal conducting layer is deposited and then patterned by etching. The patterned conducting layer is used to make the electrical connections to the device contact. A barrier insulator is deposited on the patterned conducting layer and then a spin-on-glass is deposited by several coatings to fill the recesses in the patterned conducting layer and planarize the surface. A two step etch back process is then used to further planarize the layer and remove the spin-on-glass from the conducting layer surface. The process is designed to avoid over etching into the patterned conducting layer at the edges of the elevated regions of the DRAM, where the spin-on-glass is by its very nature thin.

19 Claims, 2 Drawing Sheets

TWO STEP ETCH BACK SPIN-ON-GLASS PROCESS FOR SEMICONDUCTOR PLANARIZATION

BACKGROUND OF THE INVENTION

(1) Field of the Invention

The present invention relates to the formation of planarized insulating layers on semiconductor substrates having high irregular surface features and more particularly, to the use of a two-step etch back spin-on-glass technique for planarizing a dielectric layer over a patterned conducting layer on the substrate.

(2) Description of the Prior Art

Today's Ultra Large Scale Integration (ULSI) on the semiconductor substrate are in part due to advances in photolithographic techniques and to advances in etching. For example, improvements in optical resolution and photoresist materials have lead to submicrometer resolution in photoresist image sizes. Likewise, the replacement of wet etching with directional plasma etching has resulted in submicrometer patterns being etched in the substrate and in the conducting and insulating layers which make up the integrated circuits on semiconducting substrates.

However, the accumulated effect of depositing these layers and the etching of patterns in these layers, one patterned layer on top of the other, has resulted in irregular or substantially nonplanar surface features on the otherwise microscopically planar substrate. This rough or irregular topography also results from other structures on the substrate. For example, stacked capacitors used in the dynamic random access memory (DRAM) extend up ward on the chip and adds to this roughness problem. This roughness is made substantially worse at later processing step where multilayer metallurgy is used to connect up the discrete devices for integrated circuits.

The advancements in down scaling of devices and the inter-connecting metal wiring have not come without certain technological problems. For example, the improvement in photolithographic resolution require a more shallow depth of focus during optical exposure of the photoresist. This results in unwanted distorted photoresist images over nonplanar portions of the substrates. Likewise, anisotropic etching to pattern the various conducting layers over the nonplanar surface can result in leaving unwanted portions of the conducting layer on the sidewalls of the underlying patterns which can lead to interlevel shorts. In addition, thinning of narrow inter-connecting metal lines over steps in underlying patterned layers can result in low yield and early failure of the circuit. This is especially true at high current densities where electromigration of the metal atoms in the metal lines can lead to voids and open lines, or can result in extrusion of metal between the closely spaced lines leading to shorts.

One approach of minimizing these topographic problems is to provide processes that preserve the planar nature of the substrate surface for receiving the next level of patterned layers. This planarization requirement is particularly important at the multilayer metallurgy levels, where the accumulative roughness of the surface topography can be quite severe.

Varies methods have been used for planarizing the dielectric layers that physically and electrically isolate these semiconductor devices and conducting metal layers. For example, some methods for forming planarized insulating layers over this rough topography include depositing bias sputtered silicon oxide, depositing and flowing of doped chemical vapor deposited (CVD) oxides, such as phosphosilicate glass (PSG) and borophosphosilicate glass (BPSG), biased plasma enhanced CVD (PECVD), and similar techniques. However, many of these techniques are time consuming and require costly process equipment.

More recently, new techniques using spin-on-glasses are finding increasing use for forming interlevel insulator that can be planarized. This type of glass is of particular interest because the deposition process and planarization is relatively simple and the process utilizes low cost equipment. For example, the insulating layer is deposited by spin coating a liquid precursor, similar to the spin application of photoresist. The layer is then dried to remove the solvents and baked on a hot plate or in a oven to cure the layer and to form an inorganic oxide by pyrolysis. The spin coating application of the liquid precursor composed of a solvent containing, for example, a silicate or siloxane polymer tend to fill in the recesses between the patterned metal areas being thicker than the coating over the metal area, thereby having a planarization effect on the resulting insulating over the patterned metal layer. Generally, several coatings are required to achieve a reasonable planarity. For example, D. L. Yen U.S. Pat. No. 5,003,062 describes a method for forming a multilayer metallurgy using a spin-on-glass layer as part of the planarized insulating layer.

Although these spin-on-glasses can be effective insulators for multilevel metallurgies, it is necessary to incorporate a barrier insulating layer, such as chemical vapor deposited (CVD) silicon oxide, to prevent the spin-on-glass from contacting and eroding the patterned metal layers, which are usually composed of aluminium. Furthermore, when via holes are formed in the CVD silicon oxide/spin-on-glass layers to contact the upper metal layer, it is necessary to carefully out gas the spin-on-glass exposed in the via hole so as to avoid the degradation of the metal therein.

An alternative approach is an etch back spin-on-glass process in which the cured spin-on-glass layer is blanket etched back leaving thicker isolated portions in the recessed areas between the patterned metal and removing the spin-on-glass down to the CVD silicon oxide barrier layer over the patterned metal thereby forming essentially a planar surface. Another CVD silicon oxide layer is then deposited over this planar structure and via holes are formed therein to provide contact for the upper metal layer formed thereon. Example of similar etch back process are shown by M. W. Batty U.S. Pat. No. 4,894,351 and by P. Merenda et al U.S. Pat. No. 4,826,786. Another example of filling the recess between a patterned metal layer with spin-on-glass is shown by I. S. Hyun et al U.S. Pat. No. 4,983,546.

Although out gassing is eliminated in the via holes because the spin-on-glass is removed from over the metal, a number of other problems can now occur that are associated with the etch back normally carried out in a plasma etcher. For example, when the spin-on-glass is etched back to the CVD silicon oxide, the ideal condition is to have an etch selectivity of 1:1, so as to maintain a planar surface as the exposed surface area of the spin-on-glass decreases and the surface area of underlying CVD silicon oxide increases. However, this is difficult to achieve because as the exposed surface of spin-on-glass rapidly decreases at the CVD silicon oxide surface, the available etchant species changes and results in an etch selectivity other than 1:1. This microloading effects is observed to be a significant problem when the spacing between patterned metal layer become less than about 0.8 micrometers.

Another problem which exasperates the etch back process is the occurrence of thinning of the spin-on-glass at the regions where there are significant steps in the underlying substrate. For example, one major concern is on substrates having dynamic random access memory (DRAM) chips, where the array of closely spaced stacked capacitors formed thereon extend substantially above the surface. When the spin-on-glass is etched back over the patterned metal layer near the edge, The exposed edge can result in interlevel short or other reliability problems.

SUMMARY OF THE INVENTION

It is a principle object of this invention to provide an etch back spin-on-glass process for planarizing a dielectric insulating layer on substrates having large steps on the substrate, and having a thin spin-on-glass over those steps.

It is another object of this invention to provide by the same etch back process a process that minimizes microloading effect when back etching over a patterned metal layer.

In accordance with these objectives the invention consist of an etch back spin-on-glass method for planarization of an insulating layer formed by dispensing a spin-on-glass and curing to cover a patterned metal layer. The patterned metal contacting and interconnecting discrete integrated circuit device formed in and on a semiconductor substrate. The integrated circuit devices can consist of N-channel and P-channel field effect transistors (FET), or bipolar transistors. But more specifically, consisting of dynamic random access memory (DRAM) cells having closely spaced stacked capacitors extending substantially upward over the substrate, and thereby forms areas that have large steps in the substrate. Although DRAMS chips are specifically mentioned because of there importance in the electronic industry, it should also be obvious to one skilled in the art that the method of this invention applies to other similar types of nonplanar structures that might be formed on the substrate.

In preparation for the interconnecting metallurgy, the substrate is usually previously deposited with an insulating layer, such as a chemical vapor deposited (CVD) silicon oxide. Contact openings in the insulating layer provide the electrical means for contacting the desired devices and underlying patterned conducting layer, such as polysilicon and/or silicides. The metal layer, such as aluminium, is then deposited and conventional photolithography and plasma etching are used to pattern the layer. Another silicon oxide layer or anisotropic plasma oxide is deposited over the patterned metal as an insulating barrier layer, and about 3000 to 4000 Angstroms thick, so as to protect the metal from being eroded by the spin-on-glass which is formed next. The spin-on-glass can be applied in a number of spin coating applications with a curing step in between each coating step. However, to achieve a reasonable planarization, usually three coatings are applied having a total thickness of about 6000 Angstroms.

The etch back of the spin-on-glass is performed next and is the critical part of the invention. This etching is done in a plasma etcher in a gas mixture of trifluoromethane ($CHF_3$), carbon tetrafluoride ($CF_4$) and argon (Ar). The first etch back is performed at a high etch rate selectivity of the spin-on-glass to the underlying CVD silicon oxide barrier layer, for example between about 1.3 to 2.0. The spin-on-glass is etched back approximately to the surface of the CVD oxide barrier layer. This high selectivity etch is critical because the thin portion of the spin-on-glass, for example, at the edge of the DRAM cell area, is removed early in the etch step and the slow etching CVD silicon oxide barrier layer protects the metal from being etched. Although the CVD oxide layer is referred to as a barrier layer because in provides a barrier to the out gassing from the spin-on-glass that can erode the aluminium it can also be considered, in this invention, as a barrier to erosion by the plasma etching.

The second back etch step is now performed using the same gases, but at a lower $CF_4$ gas flow rate, which results in the etch rate selectivity of the spin-on-glass to the CVD barrier oxide being considerably lower, about 0.6. The spin-on-glass and CVD oxide barrier are now etched simultaneously to just above the patterned metal upper surface. This low etch rate selectivity minimizes the effect of the micro loading that would otherwise resulted in a rapid etching of the spin-on-glass between the closely spaced metal line, and would result in a nonplanar surface.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The two step etch back process in this invention utilizes the change in etch rates between the first etch back and the second etch back to achieve an essentially planar insulating layer over a patterned conducting layer. For example, over aluminium or other conductors used to form the interconnecting electrical wiring on semiconductor chips.

The invention also provides a means for protecting the edges on raised portions in the substrate having large steps, for example, about a micrometer in height. The spin-on-glass can become quite thin at these high steps when applied using spin coater methods. One example where the spin-on-glass can become very thin is over large steps that are associated with the memory cell area of a DRAM using stacked capacitors. The step can be quite high because of the multiplicity of polysilicon and insulating layer and the etching of those layers used in the fabrication.

Figure 1:
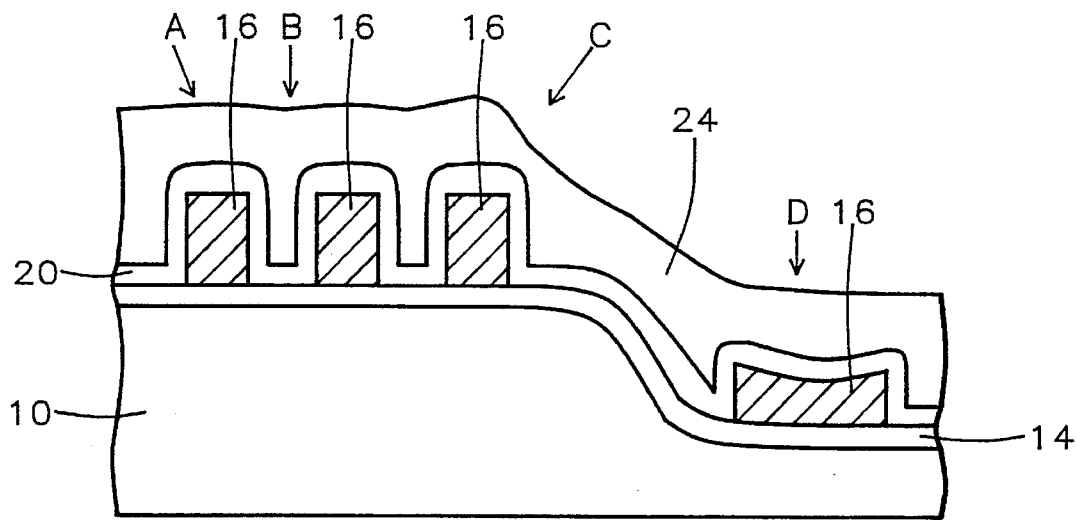
FIG. 1 illustrates schematically the cross sectional view of the substrate having a raised portion, the patterned metal layer, the barrier CVD silicon oxide, and the planarization spin-on-glass coating formed thereon.

Referring now to FIGS. 1, a cross sectional view of a portion of a substrate 10 is shown, which, for example, can be composed of single crystal silicon. The raised portion on the left side in FIG. 1 represents, for example, the step resulting from the storage array cell portion of a DRAM chip. The details of the substrate and the storage devices built thereon are not shown since they are not essential for understanding the invention.

The patterned conducting layer 16 is formed next by depositing, for example, aluminum (Al) or for improved electromigration an aluminium copper alloy (AlCu) over an insulating layer 14 having contact openings to the substrate and appropriate devices therein. The aluminum is deposited by conventional means, such as sputter deposition or physical evaporation. The contacts in layer 14 are also not shown for simplification purposes. The Al is then patterned using conventional photolithography and anisotropic plasma etching, a portion of which is shown over the raised part of the substrate and part on the lower part. The preferred thickness of this conducting layer 16 is preferably between about 6000 to 9000 Angstroms. In present day ultra large semiconductor integration (ULSI) the spacing between these patterned conducting regions can vary considerably. For example, the spacing can vary from well over a micrometer to less than 0.5 micrometer and the aspect ratio of these spacings, which is the ratio of the height to the spacing between metal lines can be greater than 2.

The formation of the planarized dielectric layer using the spin-on-glass is now formed over the patterned conducting metal layer 16 after first depositing a insulating barrier layer 20. The insulating layer 20 is an anisotropic or conventional plasma oxide which is formed by a plasma enhanced chemical vapor deposition (PECVD) process. The profile of insulating barrier layer 20 is such that the oxide is thicker on the top surface of the conducting layer 16, for example having a preferred thickness of between about 3000 to 5000 Angstroms, and being thinner in the recesses or gaps between the patterned conducting layer, for example, having a preferred thickness of between about 1800 to 4000 Angstroms. A nominal thickness being about 4500 Angstroms on the top and 3600 Angstroms in the recess.

Referring still to FIG. 1, the spin-on-glass layer 24 is formed over the insulating layer 20 by spin coating. The preferred material used is a spin-on-glass liquid which consist of a silicon-oxide (Si—O) network polymer dissolved in a common organic solvent, such as alcohol, ketones and esters. For example, the spin-on-glass material can be a series of siloxane base material marketed by the Allied-Signal Corp. under the trade name ACCUGLASS.

Referring now more particularly to the method of spin coating the substrate for forming the planarizing dielectric layer 24 over the patterned conducting layer, a multi-layered coating is usually used. For example, a triple layer spin coating is commonly used, whereby the spin coating is applied in three layers each being about 2000 Angstroms in thickness. The final total spin-on-glass thickness is then about 6000 Angstroms. The spin-on-glass is usually baked after each coating at an elevated temperature of about 425° C. to drive off the solvents, reduce cracking and improve the planarity.

As seen in FIG. 1, the spin-on-glass layer 24 varies widely in thickness across the substrate. For example, at region labeled C, where the substrate has a large step the layer is quite thin, about only 200 Angstroms thick. At region A, as shown in FIG. 1, the spin-on-glass layer is about 3500 Angstroms thick over the patterned conducting layer 20 and in the recesses indicated as region B in FIG. 1, the thickness is 13000 Angstroms thick. The large variation in thickness arises because of the leveling effect that the spin-on-glass has when applied as a liquid precursor. This results in essentially a planar surface being created over areas having submicrometer dimensions. However, next to the raised portion, where the substrate surface is depressed, that adjacent to the DRAM area, the spin-on-glass is relatively thick, as shown in the region labeled D over an isolated portion of the conducting layer 16 in the lower part of the substrate. The thickness in that region being about 4800 to 7000 Angstroms.

Figure 2:
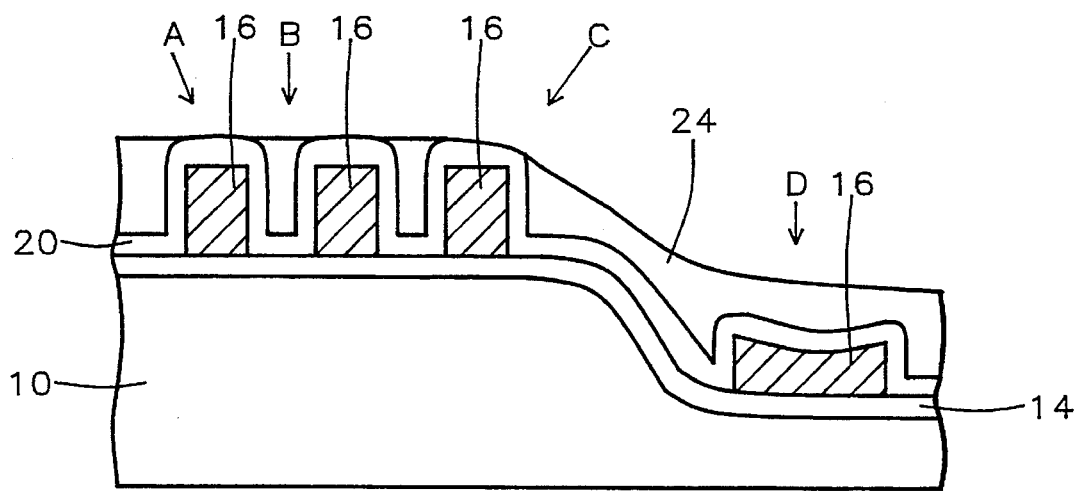
FIGS. 2 illustrates schematically the cross-section representation of FIG. 1 after the first etch back step down to the surface of the CVD silicon oxide layer.
Figure 3:
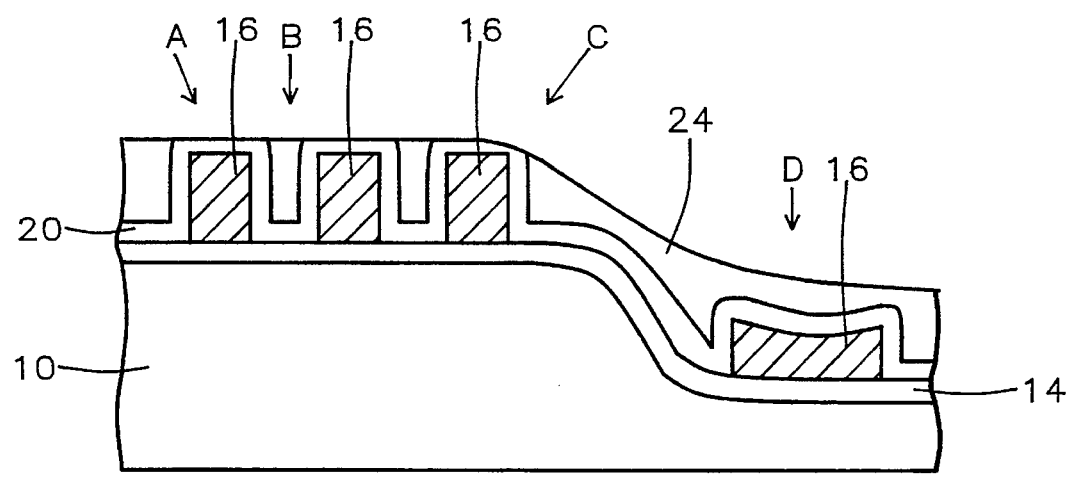
FIGS. 3 illustrates schematically the cross sectional representation of FIG. 2 after the second and final etch back in which the CVD silicon oxide and spin-on-glass are uniformly etched to just above the top surface of patterned metal layer.

Now referring to FIGS. 2 and 3, the method for the two step etch back process, of the invention, is now described, which is necessary, if over etching at the region labeled C and micro loading at regions labeled A and B are to be avoided. The process cycle time is good because both etching steps are done sequentially in the same reactive ion etcher. For example, one can used a model PR-5000 etcher manufactured by Applied Materials Corporation. The operating pressure is 260 Mtorr and the gas mixture used for both etching steps consists of trifluoromethane ($CHF_3$), carbon tetrafluoride ($CF_4$) and argon (A).

The system was optimized using Response Surface Methodology to determine the best operating parameters for etching both spin-on-glass and anisotropic plasma oxide. The operating parameters were optimized for such process parameters as etch rate, etch uniformity and etch selectivity. Based on this analysis the best operating parameters were chosen. The etching is preferably done at an input power of 800 watts and at a chamber pressure of 260 Mtorr.

Referring now to FIG. 2, the spin-on-glass layer 24, about 3000 Angstroms thick over region A, as seen in FIG. 1, is now etched to the surface of the insulating barrier layer 20, as shown in FIG. 2. The first etch back step is done at an etch selectivity for spin-on-glass to the underlying insulating barrier layer of between about 1.3 to 2.0. Because of the high selectivity, only about 1500 Angstroms of the insulating barrier layer 20 is removed in region C, leaving the major portion of insulating layer 20 to protect the underlying conducting layer 16. The gas flow rates required to achieve the necessary selectivity for $CHF_3$, $CF_4$ and Ar were respectively 80, 89 and 50 standard cubic centimeter per minute (sccm).

Referring next to FIG. 3, the second etch back step is done using a low etch rate selectivity. The etch selectivity of spin-on-glass to the insulating barrier material, is now reduced to a value of between about 0.5 to 0.7, and more specifically to a value of 0.6. This is accomplished by reducing the $CF_4$ flow from 98 sccm to 32 sccm. The other gases are not changed, that is the CHF3 is maintained at 80 sccm and Ar at 50 sccm. This has the effect of reducing the spin-on-glass etch rate relative to the etch rate of the anisotropic plasma oxide (APO) layer 20. The change in etch rate selectivity between the two layers 20 and 24 results in compensating for the micro loading effect. This occurs when the spin-on-glass is etched to the APO surface and the surface area of layer 24 decreases and that of layer 20 increases. This change in etch rate selectivity essentially achieving a planar surface in the APO insulating layer 20 over the patterned conducting layer and essentially being co-planar with the surface of the remaining spin-on-glass between the patterned conducting layer 16, as shown in FIG. 3.

Because only one of the process parameters is changed, and that parameter being the flow rate of the $CF_4$ while the other processing parameters remain unchanged, a simple two step etch back process is accomplished. The two etch backs are carried out in the same plasma etcher, thus saving time and reducing cost. As shown in FIG. 3, even after completing the two etch back process steps there remains a protective layer of about 1000 to 1200 Angstroms on the patterned conducting layer 16, adjacent to the edge of the raised portion of substrate as indicated as region C in the FIG. 3. However, as shown at region D in FIG. 3, portions of spin-on-glass may remain after the two step etch back process is completed. The thicker layer 24 generally results from the planarizing effect of the spin-on-glass filling in the recess near the edge. This does not cause a serious concern because the via holes for the next metal level are not usually formed in this region near to the step edge.

Shown in TABLE 1 of the EXAMPLE are some typical processing parameters for the two step etch back process for the high and low etch rate selectivity process. Also shown in the EXAMPLE as TABLE 2 are some typical etch rates for the spin-on-glass and the APO silicon oxide.

The process of this invention, if required, can be repeated to form the next planar insulating layer over the next level of a multi-layer metallurgy. This is accomplished by depositing another barrier insulating layer, such as a CVD silicon oxide, and providing the require via holes or feed-thru studs and then patterning a second metal layer. The method of this invention is then repeated to form the planar insulation layer.

While the invention has been particularly shown and described with reference to the preferred embodiments thereof, it will be understood by those skilled in the art that various changes in form and details may be made without departing from the spirit and scope of the invention.

EXAMPLE

TABLE 1

TWO STEP ETCH BACK PROCESS PARAMETERS

| Process Parameters | High Selectivity (1.3) | Low Selectivity (0.6) |
| --- | --- | --- |
| Power (Watts) | 800 | 800 |
| Magnetic Field (Gauss) | 50 | 50 |
| Pressure (MTorr) | 260 | 260 |
| Argon Flow (sccm) | 40 | 40 |
| $CHF_3$ (sccm) | 80 | 80 |
| $CF_4$ (sccm) | 110 | 32 |

TABLE 2

ETCH RATES VS $CF_4$ FLOW RATE

| $CF_4$ Flow (sccm) | Etch Rate Spin-on-glass (Angstroms/Min.) | Etch Rate APO Silicon oxide (Angstroms/Min.) |
| --- | --- | --- |
| 76 | 1500 | 1400 |
| 100 | 1750 | 1500 |
| 136 | 2000 | 1600 |

What is claimed is:

1. A method for forming a planarized dielectric layer over a substrate having a patterned conducting layer comprising the steps of:

providing a semiconductor substrate having semiconductor devices formed in and on said substrate and having a patterned conducting layer formed thereon;

depositing an insulating barrier layer on said patterned conducting layer and elsewhere on said substrate, said barrier layer formed by anisotropic plasma silicon oxide deposition;

coating said insulating barrier layer with a spin-on-glass layer and thereby filling recesses formed by said patterned conducting layer on said substrate;

baking said first spin-on-glass layer and out gassing said spin-on-glass layer;

performing a first etch back of said spin-on-glass using reactive ion etching with a gas mixture of carbon tetrafluoride (CF4), trifluoromethane (CHF3) and argon (Ar), said spin-on-glass layer having an etch rate of 1.3 to 2.0 times faster than said insulating barrier layer and etching to surface of said insulating barrier layer over said conducting layer;

performing a second etch back of said spin-on-glass layer and of said insulating barrier layer using reactive ion etching with a gas mixture of carbon tetrafluoride (CF4), trifluoromethane (CHF3) and argon (Ar), wherein the etch rate of said spin-on-glass layer is lower than the etch rate of said insulating barrier layer and etching to but not in top surface of said patterned conducting layer and completing said planarized dielectric layer.

2. The method of claim 1, wherein said patterned conducting layer is aluminium and having a thickness of between about 6000 to 9000 Angstroms.

3. The method of claim 1, wherein said insulating barrier layer is a anisotropic plasma silicon oxide having a thickness from between about 3000 to 5000 Angstroms.

4. The method of claim 1, wherein said spin-on-glass is a triple coating of a siloxane type having a total thickness of between about 5000 to 8000 Angstroms.

5. The method of claim 1, wherein said second etch back etch rate of said spin-on-glass layer is between about 0.5 to 0.7 as fast as the etch rate of said insulating barrier layer.

6. The method of claim 1, wherein said semiconductor devices are field effect transistors.

7. A method for forming a planarized dielectric layer over a substrate having a patterned conducting layer comprising the steps of:

providing a semiconductor substrate having semiconductor devices formed in and on said substrate and portions of said substrate having substantially high elevated areas comprising an array of stacked capacitors of a DRAM chip and having a patterned conducting layer formed thereon;

depositing an insulating barrier layer on said patterned conducting layer and elsewhere on said substrate, said barrier layer formed by anisotropic plasma silicon oxide deposition;

coating said insulating barrier layer with a spin-on-glass layer and thereby filling recesses formed by said patterned conducting layer on said substrate;

baking said spin-on-glass layer and out gassing said spin-on-glass layer;

performing a first etch back of said spin-on-glass using reactive ion etching with a gas mixture of carbon tetrafluoride (CF4), trifluoromethane (CHF3) and argon (Ar), and said spin-on-glass layer having an etch rate of 1.3 to 2.0 times faster than said insulating barrier layer and etching said spin-on-glass layer to surface of said insulating barrier layer over said conducting layer;

performing a second etch back of said spin-on-glass layer and of said insulating barrier layer using reactive ion etching with a gas mixture of carbon tetrafluoride (CF4), trifluoromethane (CHF3) and argon (Ar), wherein the etch rate of said spin-on-glass layer is lower than the etch rate of said insulating barrier layer and etching to but not in top surface of said patterned conducting layer and completing said planarized dielectric layer.

8. The method of claim 7, wherein said patterned conducting layer is aluminium and having a thickness of between about 6000 to 9000 Angstroms.

9. The method of claim 7, wherein said insulating barrier layer is a anisotropic plasma silicon oxide having a thickness from between about 3000 to 5000 Angstroms.

10. The method of claim 7, wherein said spin-on-glass is a least one coating of a siloxane type having a total thickness of between about 5000 to 8000 Angstroms.

11. The method of claim 7, wherein said second etch back etch rate of said spin-on-glass layer is between about 0.5 to 0.7 as fast as the etch rate of said insulating barrier layer.

12. The method of claim 7, wherein said semiconductor devices are field effect transistors.

13. A method for forming a planarized dielectric layer over a substrate having a patterned conducting layer comprising the steps of:

providing a semiconductor substrate having semiconductor devices formed in and on said substrate and portion of said substrate having elevated areas and having a patterned conducting layer formed thereon;

depositing an insulating barrier layer on said patterned conducting layer and elsewhere on said substrate, said barrier layer formed by anisotropic plasma silicon oxide deposition;

coating said insulating barrier layer with a spin-on-glass layer and thereby filling recesses formed by said patterned conducting layer on said substrate;

baking said first spin-on-glass layer, and out gassing said spin-on-glass layer;

performing a first etch back of said spin-on-glass layer using reactive ion etching with a gas mixture of carbon tetrafluoride (CF4), trifluoromethane (CHF3) and argon (Ar), said spin-on-glass layer having an etch rate of 1.3 to 2.0 times faster than said insulating barrier layer and etching to surface of said insulating barrier layer over said patterned conducting layer;

performing a second etch back of said spin-on-glass layer and of said insulating barrier layer using reactive ion etching with a gas mixture of carbon tetrafluoride (CF4), trifluoromethane (CHF3) and argon (Ar), wherein the etch rate of said spin-on-glass is 0.5 to 0.7 as fast as the etch rate of said insulating barrier layer and etching to but not in top surface of said patterned conducting layer and completing said planarized dielectric layer.

14. The method of claim 13, wherein said patterned conducting layer is aluminium and having a thickness of between about 6000 to 9000 Angstroms.

15. The method of claim 13, wherein said insulating barrier layer is a anisotropic plasma silicon oxide having a thickness from between about 3000 to 5000 Angstroms.

16. The method of claim 13, wherein said spin-on-glass is a triple coating of a siloxane type having a total thickness of between about 5000 to 8000 Angstroms.

17. The method of claim 14, wherein said semiconductor devices are field effect transistors.

18. A method for forming a planarized dielectric layer over a substrate having a patterned conducting layer comprising the steps of:

providing a semiconductor substrate having semiconductor devices formed in and on said substrate and portions of said substrate having substantially high elevated areas comprising an array of stacked capacitors of a DRAM chip and having a patterned conducting layer formed thereon;

depositing an insulating barrier layer on said patterned conducting layer and elsewhere on said substrate, said barrier layer formed by anisotropic plasma silicon oxide deposition;

coating said insulating barrier layer with a spin-on-glass layer and thereby filling recesses formed by said patterned conducting layer on said substrate;

baking said spin-on-glass layer and out gassing said spin-on-glass layer;

performing a first etch back of said spin-on-glass using reactive ion etching with a gas mixture of carbon tetrafluoride (CF4), trifluoromethane (CHF3) and argon (Ar) having respectively flow rates of 110, 80 and 40 standard cubic centimeters per minute (sccm), said spin-on-glass layer having a higher etch rate than said insulating barrier layer, and etching said spin-on-glass layer to surface of said insulating barrier layer over said conducting layer;

performing a second etch back of said spin-on-glass layer and of said insulating barrier layer using reactive ion etching with a gas mixture of carbon tetrafluoride (CF4), trifluoromethane (CHF3) and argon (Ar), wherein the etch rate of said spin-on-glass layer is lower than the etch rate of said insulating barrier layer and etching to, but not into the top surface of said patterned conducting layer and completing said planarized dielectric layer.

19. A method for forming a planarized dielectric layer over a substrate having a patterned conducting layer comprising the steps of:

providing a semiconductor substrate having semiconductor devices formed in and on said substrate and portion of said substrate having elevated areas and having a patterned conducting layer formed thereon;

depositing an insulating barrier layer on said patterned conducting layer and elsewhere on said substrate, said barrier layer formed by anisotropic plasma silicon oxide deposition;

coating said insulating barrier layer with a spin-on-glass layer and thereby filling recesses formed by said patterned conducting layer on said substrate;

baking said first spin-on-glass layer, and out gassing said spin-on-glass layer;

performing a first etch back of said spin-on-glass layer using reactive ion etching with a gas mixture of carbon tetrafluoride (CF4), trifluoromethane (CHF3) and argon (Ar), said spin-on-glass having a higher etch rate than said insulating barrier layer and etching to surface of said insulating barrier layer over said patterned conducting layer;

performing a second etch back of said spin-on-glass layer and of said insulating barrier layer using reactive ion etching with a gas mixture of carbon tetrafluoride (CF4), trifluoromethane (CHF3) and argon (Ar) having respectively flow rates of 32, 80 and 40 standard cubic centimeters per minute (sccm), wherein the etch rate of said spin-on-glass layer is lower than the etch rate of said insulating barrier layer and etching to but not into the top surface of said patterned conducting layer and completing said planarized dielectric layer.

* * * * *